(12) United States Patent
Joo et al.

(10) Patent No.: US 6,566,189 B2
(45) Date of Patent: May 20, 2003

(54) METHOD FOR MANUFACTURING GATE IN SEMICONDUCTOR DEVICE

(75) Inventors: Kwang Chul Joo, Kyoungki-do (KR); Hai Won Kim, Kyoungki-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 09/895,297

(22) Filed: Jul. 2, 2001

(65) Prior Publication Data

US 2002/0001934 A1 Jan. 3, 2002

(30) Foreign Application Priority Data

Jun. 30, 2000 (KR) .......................................... 2000-37138

(51) Int. Cl.⁷ ............................................ H01L 21/242
(52) U.S. Cl. ............................................... 438/240
(58) Field of Search ................................ 438/171, 190, 438/239, 240, 257, 308, 396

(56) References Cited

U.S. PATENT DOCUMENTS

| | | | |
|---|---|---|---|
| 6,258,653 B1 | * | 7/2001 | Chew et al. ................. 438/239 |
| 6,287,910 B2 | * | 9/2001 | Lee et al. .................... 438/240 |
| 6,303,481 B2 | * | 10/2001 | Park .......................... 438/591 |
| 6,319,766 B1 | * | 11/2001 | Bakli et al. ................. 438/240 |
| 6,337,289 B1 | * | 1/2002 | Narwankar et al. ......... 438/776 |
| 6,337,291 B1 | * | 1/2002 | Park et al. ................... 438/785 |
| 6,340,629 B1 | * | 1/2002 | Yeo et al. .................... 438/592 |
| 2002/0016037 A1 | * | 2/2002 | Han et al. ................... 438/250 |

* cited by examiner

*Primary Examiner*—Amir Zarabian
*Assistant Examiner*—Pamela E Perkins
(74) *Attorney, Agent, or Firm*—Pillsbury Winthrop LLP

(57) ABSTRACT

The present invention discloses a method for manufacturing a gate for semiconductor memory devices in which a TaON thin film is used as a gate dielectric film. The disclosed present invention comprises steps of forming a nitride thin film on a semiconductor substrate; forming an amorphous TaON thin film over the nitride films; subjecting the amorphous TaON thin film to effect a crystallization thereof; and forming a polysilicon film as an upper electrode over the crystallized TaON thin film.

20 Claims, 2 Drawing Sheets

METHOD FOR MANUFACTURING GATE IN SEMICONDUCTOR DEVICE

BACKGROUND OF THE INVENTION

1. Field of the Invention

The present invention relates to a method for manufacturing a gate for semiconductor devices, and more particularly a method for manufacturing a gate for semiconductor devices in which a TaON thin film is used as a gate dielectric film.

2. Description of the Related Art

Generally, in highly integrated semiconductor devices, the thickness of the gate oxide film in the semiconductor devices having a line width up to 0.1 μm has to be decreased below 40 Å in order to achieve an reduction in short channel effect and an efficient control of channels. However, such gate oxide films tend to suffer from increase leakage current resulting from direct tunneling effects. As a result, characteristics of the transistor and the capacitor will tend to be degraded. Accordingly, in order to solve this problem, a $Ta_2O_5$ film has been proposed as a substitute for $SiO_2$. The $Ta_2O_5$ film is a metallic oxide film having a high dielectric constant that can be used as a gate dielectric film in a transistor.

FIG. 1 is a cross-sectional view illustrating a conventional method for manufacturing a gate in a semiconductor device. As shown in FIG. 1, according to the conventional gate manufacturing method, a $Ta_2O_5$ film 2 is deposited as a gate dielectric film on a semiconductor substrate 1. The $Ta_2O_5$ film, which is a metallic oxide film having a high dielectric constant, is formed using tantalum ethylate ($Ta(OC_2H_5)_5$) as a raw material and $O_2$ or $N_2O$ as a reaction gas. A polysilicon film 3 is formed as a gate electrode over the $Ta_2O_5$ film 2. Subsequently, although not shown, a gate is formed according to a known method and the process of manufacturing the transistor is subsequently continued to complete the device.

However, the $Ta_2O_5$ film has an unstable chemical composition due to an unbalanced stoichiometric ratio. Therefore, substitutional Ta atoms may exist in the thin film due to the difference in the compositional ratios of Ta and O.

Also, since there may be impurities, for example, carbon atoms or carbon compounds and $H_2O$ resulting from the reaction of tantalum ethylate ($Ta(OC_2H_5)_5$) and $O_2$ or $N_2O$ gas, the transistor gate may exhibit an increased leakage current. Thus, the dielectric characteristics of the device may be degraded.

In order to suppress the excess leakage current and to prevent the resulting degradation of the dielectric characteristics, it is necessary to conduct an additional oxidation process to oxidize the substitutional Ta atoms remaining in the $Ta_2O_5$ film so as to stabilize the inherently unbalanced stoichiometric ratio of the film. In addition, after the deposition of the $Ta_2O_5$ film, it is typically necessary to conduct multiple low-temperature or high-temperature treatments.

SUMMARY OF THE INVENTION

Therefore, an object of the present invention is to solve the above-mentioned problems in the related art. Thus, an object of the present invention is to provide a method for manufacturing a gate for semiconductor devices, which is capable of suppressing the generation of leakage current of a gate by using a TaON film having a stable stoichiometric ratio as the gate dielectric film.

In accordance with one aspect of the present invention, a method for manufacturing a gate for semiconductor devices comprises the steps of: forming a nitride thin film on a semiconductor substrate; forming an amorphous TaON thin film over the nitride film; subjecting the amorphous TaON thin film to a thermal treatment at a high temperature to effect a crystallization thereof; and forming a polysilicon film as an upper electrode over the crystallized TaON thin film.

In accordance with another aspect of the present invention, a method for manufacturing a gate for semiconductor devices comprises the steps of: forming a nitride film on a semiconductor device; forming an amorphous TaON thin film over the nitride film; forming a nitride film or nitrified film over the amorphous TaON thin film; subjecting the amorphous TaON thin film to a rapid thermal process or a furnace thermal process to effect a crystallization thereof; and forming a polysilicon film as a gate electrode over the crystallized TaON thin film.

BRIEF DESCRIPTION OF THE DRAWINGS

The above objects, and other features and advantages of the present invention will become more apparent in the following detailed description in conjunction with the drawings, in which.

DESCRIPTION OF THE PREFERRED EMBODIMENTS

Now, a preferred embodiment according to the present invention will be described in detail, with reference to the annexed drawings.

Figure 1:
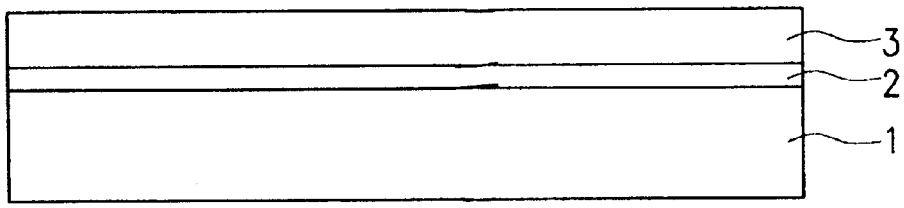
FIG. 1 is a cross-sectional view illustrating the method for manufacturing a gate for semiconductor devices in the prior art.
Figure 2A:
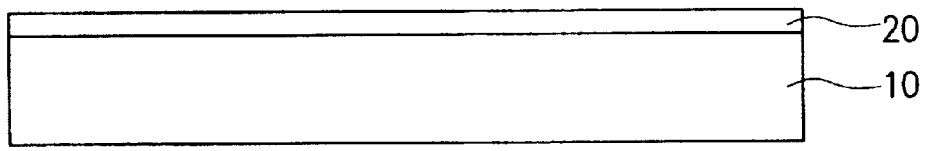
FIGS. 2A to 2D are cross-sectional views respectively illustrating sequential processing steps of a method for manufacturing a gate for semiconductor devices according to the present invention.

According to the present invention, as shown in FIG. 2A, a nitride thin film 20 is first formed on a semiconductor substrate 10 in order to prevent the formation of a low dielectric oxide layer ($SiO_2$). Typically, the low dielectric oxide layer ($SiO_2$) is formed on the semiconductor substrate before the deposition of an amorphous TaON thin film (hereinafter described) as a gate dielectric film. As a result, the low dielectric oxide layer is interposed between the amorphous TaON thin film and the semiconductor substrate 10. The formation of the nitride thin film 20 is preferably carried out by conducting a plasma treatment for about 30 seconds to 10 minutes at a temperature of about 300° C. to 600° C. under an atmosphere of $NH_3$ gas.

The formation of the nitride thin film 20 is carried out by conducting a rapid thermal process at a temperature between about 650° C. and 950° C. under an atmosphere of $NH_3$ gas or a furnace thermal treatment at a temperature of between about 650° C. and 950° C. under an atmosphere of $NH_3$ gas.

Figure 2B:
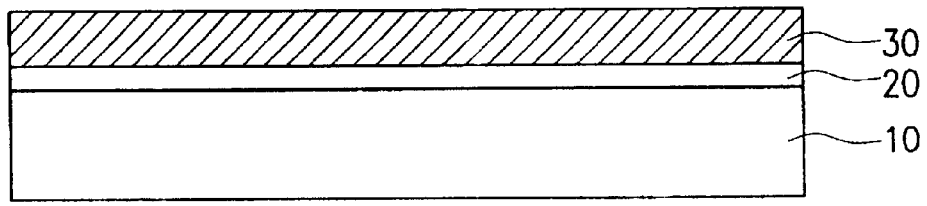

Next, as shown in FIG. 2B, a TaON thin film 30 as a gate dielectric film is deposited over the nitride film 20. The TaON thin film 30 has an amorphous structure. The deposition of the TaON thin film 30 is carried out by supplying tantalum ethylate ($Ta(OC_2H_5)_5$) as a raw material in a predetermined amount via a flow regulator to a vaporizer, kept at 150° C. to 200° C., in which the raw material is evaporated to produce Ta chemical vapor. The resulting Ta chemical vapor is then supplied to an LPCVD (Low Pressure Chemical Vapor Deposition) chamber, to which $NH_3$ gas is supplied at a flow rate of about 10 to 1,000 sccm, under the condition in which the LPCVD chamber is maintained at a temperature between about 300° C. and 600° C. The Ta chemical vapor then reacts with the supplied $NH_3$ gas.

Preferably, the deposited amorphous TaON thin film 30 has a thickness of less than 150 Å. Here, where the nitride film 20 is formed on the semiconductor substrate 10 by a plasma treatment, the amorphous TaON thin film 30 may be formed in an in-situ fashion. On the other hand, where the nitride film 20 is formed by a rapid thermal process or a furnace thermal treatment, the amorphous TaON thin film may be formed in an in-situ or ex-situ fashion.

Figure 2C:
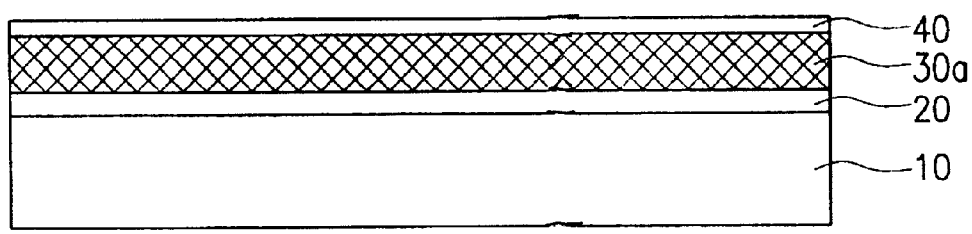

Subsequently, as shown in FIG. 2C, the amorphous TaON thin film 30 is subjected to a thermal treatment in order to densify the structure thereof, resulting in strengthened bonding forces. As the thermal treatment, a rapid thermal process may be carried out for a period of about 30 seconds to 10 minutes at a temperature between about 650° C. and 950° C. Otherwise, the amorphous TaON thin film 30 may be subjected to a furnace thermal treatment at a temperature between about 650° C. and 950° C. under an atmosphere of one of $N_2$, $O_2$, and $N_2O$. As a result, a nitride film 40 is formed over the amorphous TaON thin film 30. Simultaneously, the amorphous TaON thin film 30 is crystallized to form a crystallized TaON thin film 30a.

Also, before the crystallization of the amorphous TaON thin film 30, it is possible to form a nitride film over the amorphous TaON thin film 30 using plasma at a temperature between about 300° C. and 600° C. under an atmosphere of $NH_3$ or $N_2/H_2$ gas in either an in-situ or ex-situ fashion. On the other hand, it is possible to form a nitrified film over the amorphous TaON thin film 30 by conducting the same plasma treatment, except that an atmosphere of $N_2O$ or $O_2$ gas is used.

The amorphous TaON thin film resulting from the above plasma treatment is then preferably subjected to a thermal treatment according to a rapid thermal process at a temperature between about 650° C. and 950° C. for about 30 seconds to 10 minutes or a furnace thermal treatment for about 1 minute to 60 minutes so as to form a crystallized TaON thin film 40.

Figure 2D:
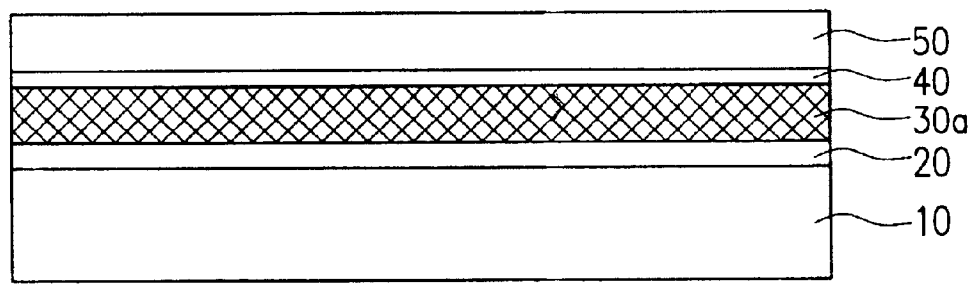

Finally, as shown in FIG. 2D, a silicon film 50, as a gate electrode, is deposited over the crystallized TaON thin film 30a. After this, although not shown, a gate is then formed according to a known method and the remainder of the process is completed to form the finished semiconductor devices.

As described above, the method for manufacturing a gate of a semiconductor device according to the present invention has the following benefits.

In accordance with the present invention, an amorphous TaON thin film is used as a gate dielectric film to provide a high dielectric constant, as compared to a $SiO_2$ film. It is also possible to provide a stable bonding structure, as compared to the conventional $Ta_2O_5$ thin film, thereby reducing the oxidation reactivity with a gate electrode. Furthermore, by virtue of a stable Ta—O—N bonding structure, it is possible to achieve an improvement in electric characteristics, that is, an increased resistance against an externally applied electrical impact and a suppression of the leakage current.

In addition, after the deposition of the amorphous TaON thin film, it is possible to form a nitride film while concurrently inducing a crystallization thereof by using a furnace thermal treatment at a temperature between about 650° C. and 950° C. under an atmosphere of $NH_3$ gas for either about 30 seconds to 10 minutes or about 1 minute to 60 minutes. Thus, the number of processes used can be reduced. Accordingly, it is possible to save manufacturing costs and to increase the producibility.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a gate in a semiconductor device, comprising steps of:
   forming a nitride film on a semiconductor substrate;
   forming an amorphous TaON thin film over the nitride film;
   crystallizing the amorphous TaON thin film; and
   forming a gate electrode over the crystallized TaON thin film.

2. The method according to claim 1, wherein the nitride film is provided to prevent the formation of a natural oxide film formed during a deposition of the TaON thin film and a subsequent thermal treatment at high temperature in a gate dielectric film manufacturing process, and the step for forming the nitride film is carried out by conducting a plasma treatment for about 30 seconds to 10 minutes at a temperature between about 300° C. and 600° under an atmosphere of $NH_3$ gas.

3. The method according to claim 1, wherein the step for forming the nitride film is carried out by conducting a rapid thermal process at a temperature between about 650° C. and 950° C. under an atmosphere of $NH_3$ gas.

4. The method according to claim 1, wherein the step for forming the nitride film is carried out by conducting a furnace thermal treatment at a temperature between about 650° C. and 950° C. under an atmosphere of $NH_3$ gas.

5. The method according to claim 1, wherein the step for depositing the TaON thin film comprises the steps of:
   supplying tantalum ethylate ($Ta(OC_2H_5)_5$) as a raw material in a predetermined amount via a flow regulator to a vaporizer, kept at a temperature of about 150° C. to 200° C., in which the raw material is evaporated to produce Ta chemical vapor; and
   supplying the resulting Ta chemical vapor along with $NH_3$ gas of a flow rate of about 10 to 1,000 sccm to a low pressure chemical vapor deposition chamber at a temperature between about 300° C. and 600° C., so that the Ta chemical vapor reacts with the supplied $NH_3$ gas, thereby forming a TaON thin film.

6. The method according to claim 1, wherein the deposited amorphous TaON thin has a thickness of less than 150 Å.

7. The method according to claim 1, wherein the amorphous TaON thin film is formed in-situ, where the nitride film is formed on the semiconductor substrate by a plasma treatment before formation of the amorphous TaON thin film.

8. The method according to claim 1, wherein the amorphous TaON thin film is formed one of in-suit and ex-situ where the nitride film is formed on the semiconductor substrate by one of a rapid thermal process and a furnace thermal treatment before formation of the amorphous TaON thin film.

9. The method according to claim 1, which further comprises one of:

a step for forming a nitride film over the amorphous TaON thin film using plasma at a temperature between about 300° C. and 600° C. under an atmosphere of one of $NH_3$ and $N_2/H_2$ gas in one of an in-situ and ex-situ fashion; and a step for forming a nitrified film over the amorphous TaON thin film using plasma at a temperature between about 300° C. and 600° C. under an atmosphere of one of $N_2O$ and $O_2$ gas in one of an in-situ and an ex-situ fashion, before a crystallization of the amorphous TaON thin film.

10. The method according to claim 1, wherein the step for crystallizing the TaON thin film carried out by conducting one of:

a rapid thermal process for about 30 seconds to 10 minutes at a temperature between about 650° C. and 950° C.; and a furnace thermal treatment at a temperature between about 650° C. and 950° C. for about 1 minute to 60 minutes.

11. The method according to claim 1, wherein the step for crystallizing the amorphous TaON thin film is carried out using a thermal treatment at a high temperature.

12. The method according to claim 11, wherein the thermal treatment at a high temperature is carried out by subjecting the amorphous TaON thin film to a rapid thermal process at a temperature between about 650° C. and 950° C. for about 30 seconds to 10 minutes, thereby forming a nitride film and a crystallized TaON thin film simultaneously.

13. The method according to claim 11, wherein the thermal treatment at a high temperature is carried out by subjecting the amorphous TaON thin film to a furnace thermal treatment at a temperature between about 650° C. and 900° C. for about 1 minute to 60 minutes, thereby forming a nitride film and a crystallized TaON thin film simultaneously.

14. A method for manufacturing a gate in a semiconductor device, comprising steps of:

forming a first nitride film on a semiconductor device;

forming an amorphous TaON thin film over the first nitride film;

forming a second nitride film or nitrified film over the amorphous TaON thin film;

subjecting the amorphous TaON thin film to a rapid thermal process or a furnace thermal process to effect a crystallization thereof; and forming a gate electrode over the crystallized TaON thin film.

15. The method according to claim 14, wherein the amorphous TaON thin film is formed in-situ, where the first nitride film is formed on the semiconductor substrate by a plasma treatment before formation of the amorphous TaON thin film.

16. The method according to claim 14, wherein the amorphous TaON thin film is formed one of situ and ex-situ, where the first nitride film is formed the semiconductor substrate by one of a rapid thermal process and a furnace thermal treatment before formation of the amorphous TaON thin film.

17. The method according to claim 14, which further comprises one of:

a step for forming a nitride film over the amorphous TaON thin film using plasma at a temperature between about 300° C. and 600° under an atmosphere of one of $NH_3$ and $N_2/H_2$ gas in one of in-situ and ex-situ; and a step for forming a nitrified film over the amorphous TaON thin film using plasma at a temperature between about 300° C. and 600° C. under an atmosphere of one of $N_2O$ gas and $O_2$ gas in one of in-situ and ex-situ, before the crystallization of the amorphous TaON thin film.

18. The method according to claim 14, wherein the step for crystallizing the TaON thin film plasma-treated is carried out by conducting one of:

a rapid thermal process for a period of about 30 seconds to 10 minutes at a temperature between about 650° and 950° C.; and a furnace thermal treatment at a temperature between about 650° C. and 950° C. for about 1 minute to 60 minutes.

19. The method according to claim 14, wherein the step for subjecting the amorphous TaON thin film to a rapid thermal process is carried out at a temperature between about 650° C. and 950° C. for about 30 seconds to 10 minutes, thereby forming a nitride film and a crystallized TaON thin film simultaneously, and the step for subjecting the amorphous TaON thin film to a furnace thermal treatment at a temperature between about 650° C. and 900° C. for about 1 minute to 60 minutes, thereby forming a nitride film and a crystallized TaON thin film simultaneously.

20. The method according to claim 14, wherein the deposited amorphous TaON thin film has a thickness of less than 150 Å.

* * * * *